United States Patent
Park et al.

(10) Patent No.: US 9,269,491 B2
(45) Date of Patent: Feb. 23, 2016

(54) MULTILAYER CERAMIC CAPACITOR AND MOUNTING CIRCUIT BOARD THEREFOR

(71) Applicant: SAMSUNG ELECTRO-MECHANICS CO., LTD., Suwon, Gyunggi-do (KR)

(72) Inventors: Sang Soo Park, Gyunggi-do (KR); Heung Kil Park, Gyunggi-do (KR)

(73) Assignee: Samsung Electro-Mechanics Co., Ltd., Suwon-si, Gyeonggi-Do (KR)

( * ) Notice: Subject to any disclaimer, the term of this patent is extended or adjusted under 35 U.S.C. 154(b) by 54 days.

(21) Appl. No.: 14/067,904

(22) Filed: Oct. 30, 2013

(65) Prior Publication Data

US 2015/0014038 A1    Jan. 15, 2015

(30) Foreign Application Priority Data

Jul. 9, 2013  (KR) ........................ 10-2013-0080242

(51) Int. Cl.
*H01G 4/248* (2006.01)
*H01G 2/06* (2006.01)
(Continued)

(52) U.S. Cl.
CPC .............. *H01G 2/065* (2013.01); *H01G 4/248* (2013.01); *H01G 4/252* (2013.01); *H01G 4/30* (2013.01); *H05K 3/3442* (2013.01); *H01G 4/005* (2013.01); *H05K 1/181* (2013.01); *H05K 2201/10015* (2013.01); *H05K 2201/1031* (2013.01);
(Continued)

(58) Field of Classification Search
CPC ........ H01G 4/248; H01G 4/252; H01G 4/005
USPC .......... 361/301.4, 306.1, 306.3, 308.1, 308.2, 361/310
See application file for complete search history.

(56) References Cited

U.S. PATENT DOCUMENTS 6,181,544 B1 *  1/2001  Nakagawa et al. ........ 361/321.1
6,388,864 B1 *  5/2002  Nakagawa et al. ........... 361/309
(Continued)

FOREIGN PATENT DOCUMENTS

JP     62-135426 U     2/1986
JP     04-188808 A     7/1992
(Continued)

OTHER PUBLICATIONS

Korean Office Action issued in Korean Application No. 10-2013-0080242 dated Jul. 7, 2014, with English Translation.
(Continued)

*Primary Examiner* — Dion R Ferguson
(74) *Attorney, Agent, or Firm* — McDermott Will & Emery LLP

(57) ABSTRACT

There is provided a multilayer ceramic capacitor including: a ceramic body; first and second internal electrodes disposed to face each other within a ceramic body, and having respective lead portions exposed to an upper surface of the ceramic body; first and second external electrodes formed on the upper surface of the ceramic body and connected to the lead portions, respectively; and first and second terminal frames each including a vertical portion facing end surfaces of the ceramic body and upper and lower horizontal portions facing upper and lower surfaces of the ceramic body, respectively, wherein the upper horizontal portions are connected to the first and second external electrodes, respectively, and adhesive layers are provided between the upper horizontal portions and the first and second external electrodes, respectively.

12 Claims, 5 Drawing Sheets

(51) Int. Cl.
*H01G 4/30* (2006.01)
*H01G 4/252* (2006.01)
*H05K 3/34* (2006.01)
*H05K 1/18* (2006.01)
*H01G 4/005* (2006.01)

(52) U.S. Cl.
CPC ............... *H05K2201/10636* (2013.01); *H05K 2201/10962* (2013.01); *H05K 2201/2045* (2013.01)

(56) References Cited

U.S. PATENT DOCUMENTS

| | | | |
|---|---|---|---|
| 6,958,899 B2* | 10/2005 | Togashi et al. | 361/303 |
| 2008/0239621 A1* | 10/2008 | Tajuddin et al. | 361/306.1 |
| 2010/0188798 A1* | 7/2010 | Togashi et al. | 361/306.3 |
| 2011/0157767 A1 | 6/2011 | Hur et al. | |
| 2011/0235234 A1* | 9/2011 | Yamamoto et al. | 361/321.1 |
| 2013/0050893 A1 | 2/2013 | Kim | |

FOREIGN PATENT DOCUMENTS

| | | |
|---|---|---|
| JP | 5-4451 U | 1/1993 |
| JP | 07-022274 A | 1/1995 |
| JP | 08-017679 A | 1/1996 |
| JP | 08-335528 A | 12/1996 |
| JP | 11-045821 A | 2/1999 |
| JP | 11-251186 A | 9/1999 |
| JP | 2000-082636 A | 3/2000 |
| JP | 2000-223357 A | 8/2000 |
| JP | 2000-235931 A | 8/2000 |
| JP | 2000-340446 A | 12/2000 |
| JP | 2004-335963 A | 11/2004 |
| JP | 3847265 B2 | 11/2006 |
| JP | 2010-177370 A | 8/2010 |
| JP | 2011-139021 A | 7/2011 |
| JP | 2012-023322 A | 2/2012 |
| JP | 2014-229868 A | 12/2014 |
| KR | 10-2010-0087622 A | 8/2010 |
| KR | 10-2013-0022825 A | 3/2013 |

OTHER PUBLICATIONS

Japanese Office Action issued in Japanese Patent Application No. 2013-213499 dated Jan. 27, 2015, with English Translation.

Japanese Office Action dated Dec. 15, 2015 issued in Japanese Patent Application No. 2013-213499.

* cited by examiner

MULTILAYER CERAMIC CAPACITOR AND MOUNTING CIRCUIT BOARD THEREFOR

CROSS-REFERENCE TO RELATED APPLICATION

This application claims the benefit of Korean Patent Application No. 10-2013-0080242 filed on Jul. 9, 2013, with the Korean Intellectual Property Office, the disclosure of which is incorporated herein by reference.

BACKGROUND OF THE INVENTION

1. Field of the Invention

The present invention relates to a multilayer ceramic capacitor and a mounting circuit board thereof.

2. Description of the Related Art

Since a multilayer ceramic capacitor (MLCC), one of multilayer chip electronic components, has advantages such as a small size, high capacitance, easiness of mounting, and the like, the multilayer ceramic capacitor may be used in various electronic devices.

For example, a multilayer ceramic capacitor may be used as a chip type condenser mounted on circuit boards of various electronic products such as display devices including liquid crystal displays (LCDs), plasma display panels (PDPs), and the like, computers, personal digital assistants (PDAs), and mobile phones to serve to charge or discharge electricity.

Generally, the multilayer ceramic capacitor may have a structure in which a plurality of dielectric layers and internal electrodes having opposite polarities and interposed between the dielectric layers are alternately laminated.

In this case, since the dielectric layers have piezoelectricity, when direct current (DC) or alternating current (AC) voltage is applied to the multilayer ceramic capacitor, a piezoelectric phenomenon is generated between the internal electrodes, thereby generating periodic vibrations while expanding and contracting the volume of a ceramic body according to frequency.

Such vibrations may be transferred to a circuit board through external electrodes of the multilayer ceramic capacitor and a solder connecting the external electrodes to the circuit board, such that the entire circuit board may become an acoustically reflective surface to generate a vibration sound as noise.

This vibration sound may correspond to an audible frequency range of 20 to 20,000 Hz making listeners uncomfortable. The vibration sound, potentially providing unpleasant feeling to listeners, is known as acoustic noise.

Recently, since acoustic noise generated in the multilayer ceramic capacitor as described above maybe evident due to noise reductions in components of electronic devices, research into a technology for reducing the acoustic noise generated in the multilayer ceramic capacitor has been required.

As a method of reducing the acoustic noise as described above, a method of mounting a multilayer ceramic capacitor so as to be spaced apart from a circuit board by a predetermined distance using a metal frame has been disclosed.

However, in order to reduce the acoustic noise to a predetermined level using the metal frame, a distance between the metal frame and the circuit board should be increased to be greater than a predetermined standard distance.

In addition, since the above-described distance increase between the metal frame and the circuit board results in an increase in a height of a product in which the multilayer ceramic capacitor is mounted, it may be difficult to use the metal frame in a set having a height limitation.

A method of reducing acoustic noise transferred from a multilayer ceramic capacitor to a circuit board using a metal terminal is disclosed in the following Patent Document 1, but a method of reducing a size of a product is not disclosed therein.

RELATED ART DOCUMENT (Patent Document 1) Korean Patent Laid-Open Publication No. 2010-0087622

SUMMARY OF THE INVENTION

An aspect of the present invention provides a multilayer ceramic capacitor capable of effectively reducing acoustic noise resulted from vibrations generated by a piezoelectric phenomenon in the multilayer ceramic capacitor being transferred to a circuit board, while not increasing a height of a product in which the multilayer ceramic capacitor is mounted.

According to an aspect of the present invention, there is provided a multilayer ceramic capacitor including: a ceramic body formed by laminating a plurality of dielectric layers in a width direction; a plurality of first and second internal electrodes disposed to face each other within the ceramic body, having each of the dielectric layers interposed therebetween, and having respective lead portions exposed to an upper surface of the ceramic body; first and second external electrodes formed on the upper surface of the ceramic body and connected to the lead portions, respectively; and first and second terminal frames each including a vertical portion facing end surfaces of the ceramic body and upper and lower horizontal portions facing upper and lower surfaces of the ceramic body, respectively, wherein the upper horizontal portions of the first and second terminal frames are connected to the first and second external electrodes, respectively, and adhesive layers are provided between the upper horizontal portions and the first and second external electrodes, respectively.

The adhesive layers may be provided in a dot shape so that the upper horizontal portions locally contact the external electrodes.

The first and second terminal frames may include downward protrusions formed on the upper horizontal portions to locally contact the first and second external electrodes, respectively; and upward protrusions formed on the lower horizontal portions so as to locally contact the lower surface of the ceramic body, respectively, gaps being provided between the ceramic body and the first and second terminal frames, respectively.

The multilayer ceramic capacitor may further include first and second plating layers formed on the first and second external electrodes.

The first and second plating layers may include a nickel (Ni) plating layer formed on the first and second external electrodes; and a tin (Sn) plating layer formed on the nickel plating layer.

The first and second terminal frames may include an opening formed in at least one of portions thereof connecting the vertical portion and the upper and lower horizontal portions to each other.

In the first and second terminal frames, the vertical part may have a width narrower than that of the upper and lower horizontal portions.

According to another aspect of the present invention, there is provided a mounting circuit board for a multilayer ceramic capacitor, the mounting circuit board including: a circuit board having first and second electrode pads formed thereon; and at least one multilayer ceramic capacitor mounted on the circuit board; wherein the multilayer ceramic capacitor includes: a ceramic body formed by laminating a plurality of dielectric layers in a width direction; a plurality of first and second internal electrodes disposed to face each other within the ceramic body, having each of the dielectric layers interposed therebetween, and having respective lead portions exposed to an upper surface of the ceramic body; first and second external electrodes formed on the upper surface of the ceramic body and connected to the lead portions, respectively; and first and second terminal frames each including a vertical portion facing end surfaces of the ceramic body and upper and lower horizontal portions facing upper and lower surfaces of the ceramic body, respectively, the upper horizontal portions of the first and second terminal frames being connected to the first and second external electrodes, respectively, adhesive layers being provided between the upper horizontal portions and the first and second external electrodes, respectively, and the lower horizontal portions and the first and second electrode pads being connected to each other by a solder.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
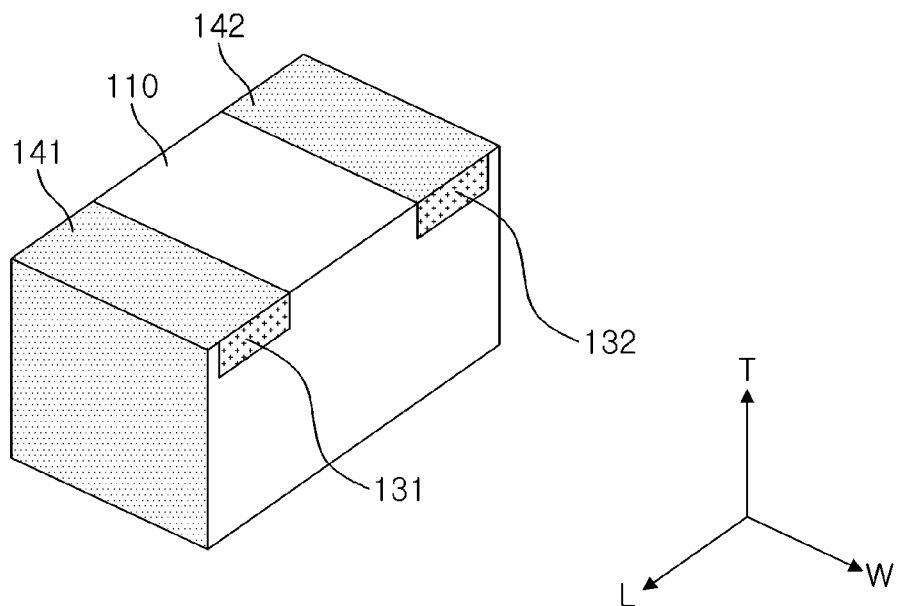
FIG. 1 is a perspective view schematically showing a multilayer ceramic capacitor according to an embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements maybe exaggerated for clarity, and the same reference numerals will be used throughout to designate the same or like elements.

Multilayer Ceramic Capacitor

Figure 2:
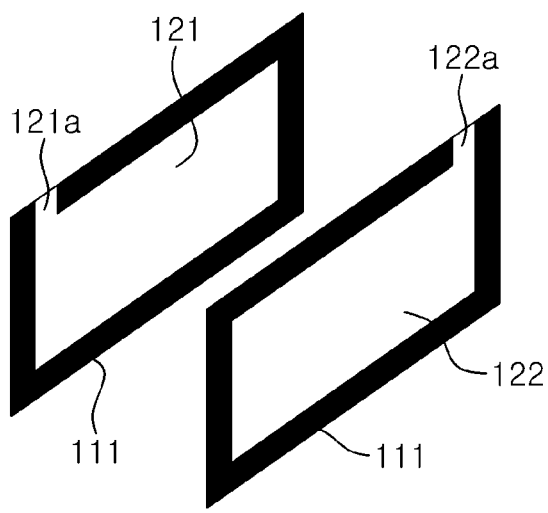
FIG. 2 is an exploded perspective view showing a structure of internal electrodes applied to the multilayer ceramic capacitor of FIG. 1.
Figure 3:
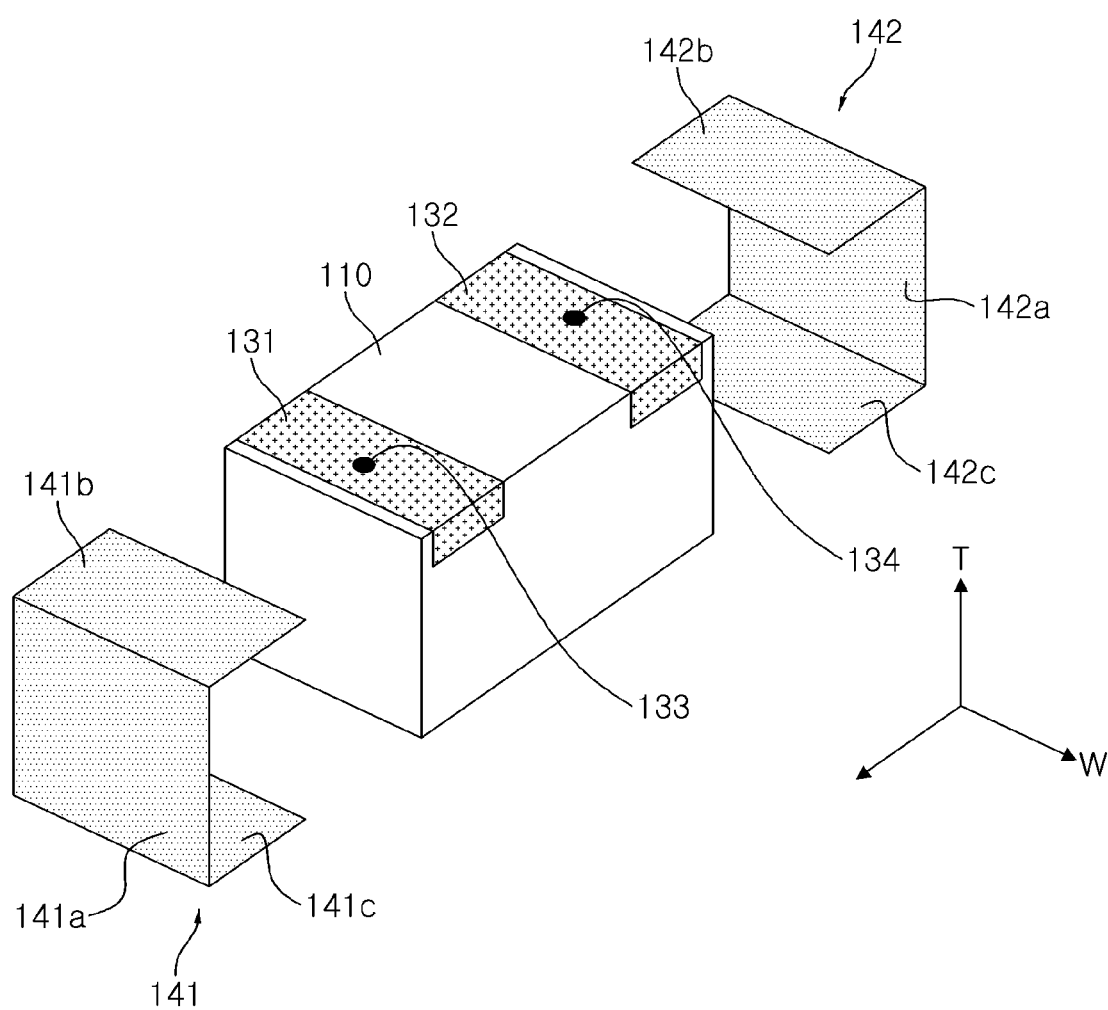
FIG. 3 is an exploded perspective view showing a structure in which terminal frames are separated from the multilayer ceramic capacitor of FIG. 1.

FIG. 1 is a perspective view schematically showing a multilayer ceramic capacitor according to an embodiment of the present invention, FIG. 2 is an exploded perspective view showing a structure of internal electrodes applied to the multilayer ceramic capacitor of FIG. 1, and FIG. 3 is an exploded perspective view showing a structure in which terminal frames are separated from the multilayer ceramic capacitor of FIG. 1.

When directions are defined to clearly describe embodiments of the present invention, L, W and T shown in the accompanying drawings refer to a length direction, a width direction, and a thickness direction, respectively.

Here, the width direction may be the same as a lamination direction in which dielectric layers are laminated.

Referring to FIG. 1, a multilayer ceramic capacitor 100 according to the embodiment of the invention may include a ceramic body 110 in which a plurality of dielectric layers 111 are laminated in the width direction, a plurality of first and second internal electrodes 121 and 122, first and second external electrodes 131 and 132 electrically connected to the first and second internal electrodes 121 and 122, respectively, and first and second terminal frames 141 and 142.

The ceramic body 110 may be formed by laminating the plurality of ceramic dielectric layers 111 and then sintering the same. Adjacent dielectric layers 111 may be integrated with each other such that boundaries therebetween may not be readily apparent.

In addition, the ceramic body 110 may have a hexahedral shape. In the present embodiment, surfaces of the ceramic body 110 facing each other in the thickness direction may be defined as first and second main surfaces, surfaces connecting the first and second main surfaces to each other and facing each other in the length direction may be defined as first and second end surfaces, and surfaces facing each other in the width direction may be defined as first and second side surfaces.

The dielectric layer 111 may contain a ceramic material having high permittivity, for example, barium titanate (BaTiO$_3$) based ceramic powder, or the like, but the invention is not limited thereto as long as sufficient capacitance may be obtained.

In addition, the dielectric layer 111 may further contain various ceramic additives such as transition metal oxides or carbides, a rare earth element, magnesium (Mg), aluminum (Al), or the like, an organic solvent, a plasticizer, a binder, a dispersant, or the like, in addition to the ceramic powder, as needed.

Referring to FIG. 2, the first and second internal electrodes 121 and 122 having opposite polarities may have lead portions 121a and 122a exposed to the first main surface of the ceramic body 110, respectively.

The first and second internal electrodes 121 and 122 may be formed on at least one surface of individual ceramic sheets forming the dielectric layers 111, and may be stacked in the ceramic body 110, having each of the dielectric layers 111 therebetween, so that the lead portions 121a and 122a are alternately exposed to both end portions of the first main surface in the length direction.

In this case, the first and second internal electrodes 121 and 122 may be electrically insulated from each other by the dielectric layer 111 disposed therebetween, and capacitance of the multilayer ceramic capacitor 100 may be in proportion to an overlap area of the first and second internal electrodes 121 and 122 in the direction in which the dielectric layers 111 are laminated.

In addition, the first and second internal electrodes 121 and 122 may be formed of a conductive metal, for example, at least one of silver (Ag), palladium (Pd), platinum (Pt), nickel (Ni), and copper (Cu), and an alloy thereof, but the invention is not limited thereto.

Referring to FIG. 3, the first and second external electrodes 131 and 132 may be extended from the first main surface of the ceramic body 110 to the first and second side surfaces so as to cover the plurality of first and second lead portions 121a and 122a exposed to the first main surface, respectively, to thereby be electrically connected thereto.

In addition, the first and second external electrodes 131 and 132 may be formed of a conductive metal, for example, at least one of silver (Ag), palladium (Pd), platinum (Pt), nickel (Ni), and copper (Cu), and an alloy thereof, but the invention is not limited thereto.

Referring to FIG. 3, the first and second terminal frames 141 and 142 may include vertical portions 141a and 142a facing the first and second end surfaces, upper horizontal portions 141b and 142b facing the first main surface of the ceramic body 110, and lower horizontal portions 141c and 142c facing the second main surface.

That is, the first and second terminal frames 141 and 142 may have a '⊏' shape. In this case, the upper horizontal portions 141b and 142b may contact the first and second external electrodes 131 and 132 to be electrically connected thereto, respectively.

Further, adhesive layers 133 and 134 adhering the upper horizontal portions 141b and 142b to the first and second external electrodes 131 and 132, respectively, may be provided between the upper horizontal portions 141b and 142b and the first and second external electrodes 131 and 132, respectively.

In this case, the adhesive layers 133 and 134 may be formed in a dot shape to allow the upper horizontal portions 141b and 142b to locally contact the first and second external electrodes 131 and 132, respectively, so that vibrations transferred to the first and second terminal frames 141 and 142 may be significantly reduced.

Meanwhile, first and second plating layers (not shown) may be formed on the first and second external electrodes 131 and 132, as needed.

The first and second plating layers may include a nickel (Ni) plating layer formed on the first and second external electrodes 131 and 132 and a tin (Sn) plating layer formed on the nickel plating layer.

The first and second plating layers are provided to increase adhesion strength between the multilayer ceramic capacitor 100 and a circuit board at the time of mounting the multilayer ceramic capacitor 100 on the circuit board, or the like, by a solder. The plating process may be performed by a method known in the art, and lead-free plating maybe preferable in consideration of eco-friendly factors, but the invention is not limited thereto.

Mounting Circuit Board for Multilayer Ceramic Capacitor

Figure 4:
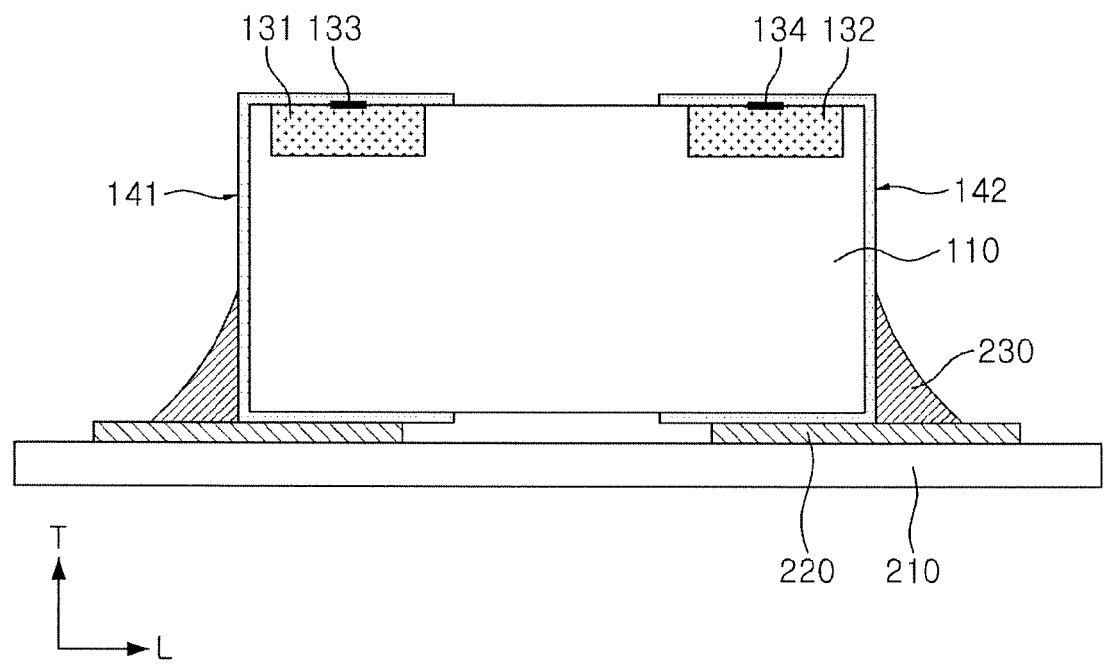
FIG. 4 is a front view schematically showing a mounting circuit board for the multilayer ceramic capacitor according to an embodiment of the present invention.

FIG. 4 is a front view schematically showing amounting circuit board for the multilayer ceramic capacitor according to an embodiment of the present invention.

Referring to FIG. 4, a mounting circuit board for the multilayer ceramic capacitor 100 according to the embodiment of the invention may include a circuit board 210 on which the multilayer ceramic capacitor 100 is mounted, and first and second electrode pads 220 formed on the circuit board 210 to be spaced apart from each other.

Here, the multilayer ceramic capacitor 100 may be mounted such that a surface of the ceramic body opposing the surface thereof on which the first and second external electrodes 131 and 132 are formed, that is, the second main surface of the ceramic body 110 faces the circuit board 210, and may be installed so as to be electrically connected to the circuit board 210 by a solder 230 in a state in which the lower horizontal portions 141c and 142c of the first and second terminal frames 141 and 142 are positioned to contact the first and second electrode pads 220.

When voltages having different polarities are applied to the first and second electrodes 131 and 132 of the multilayer ceramic capacitor 100 in a state in which the multilayer ceramic capacitor 100 is mounted on the circuit board 210, the ceramic body 110 may be expanded and contracted in the thickness direction by an inverse piezoelectric effect of the dielectric layers 111, thereby generating vibrations.

In this case, the first and second terminal frames 141 and 142 are formed in the '⊏' shape, such that the first and second terminal frames are adhered to the first and second external electrodes 131 and 132.

Therefore, there is no need to increase a distance between the terminal frame and the circuit board to be more than a predetermined standard distance, such that a height of a product in which the multilayer ceramic capacitor 100 is mounted may be reduced, and vibrations generated by a piezoelectric phenomenon in the multilayer ceramic capacitor 100 may be absorbed by elastic force of the first and second terminal frames 141 and 142, such that acoustic noise due to the vibrations transferred to the circuit board 210 maybe reduced.

MODIFIED EXAMPLES

Figure 5:
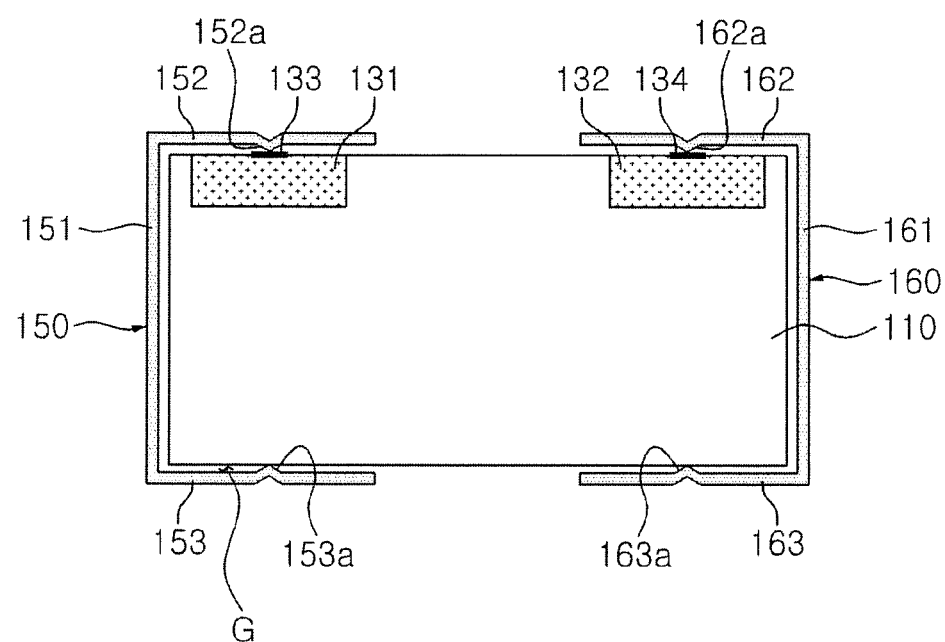
FIG. 5 is a front view schematically showing a multilayer ceramic capacitor according to another embodiment of the present invention.

FIG. 5 is a front view schematically showing a multilayer ceramic capacitor according to another embodiment of the invention.

In this case, since a structure in which the ceramic body 110, the first and second internal electrodes 121 and 122, the first and second external electrodes 131 and 132 are formed is the same as that in the above-mentioned embodiment, a detailed description thereof will be omitted. Here, first and second terminal frames 150 and 160 having a structure different from that in the above-mentioned embodiment as shown in FIG. 5 will be described in detail.

Referring to FIG. 5, in the first and second terminal frames 150 and 160, downward protrusions 152a and 162a may be formed on upper horizontal portions 152 and 162 to locally contact the first and second external electrodes 131 and 132, respectively, and upward protrusions 153a and 163a may be formed on lower horizontal portions 153 and 163 to locally contact the second main surface of the ceramic body 110 to thereby support the ceramic body 110, respectively. Gaps are provided between the ceramic body 110 and the first and second terminal frames 150 and 160. When the first and second terminal frames 150 and 160 locally contact the ceramic body 110 as described above, transmission of vibrations to the first and second terminal frames 150 and 160 may be significantly reduced.

Figure 6:
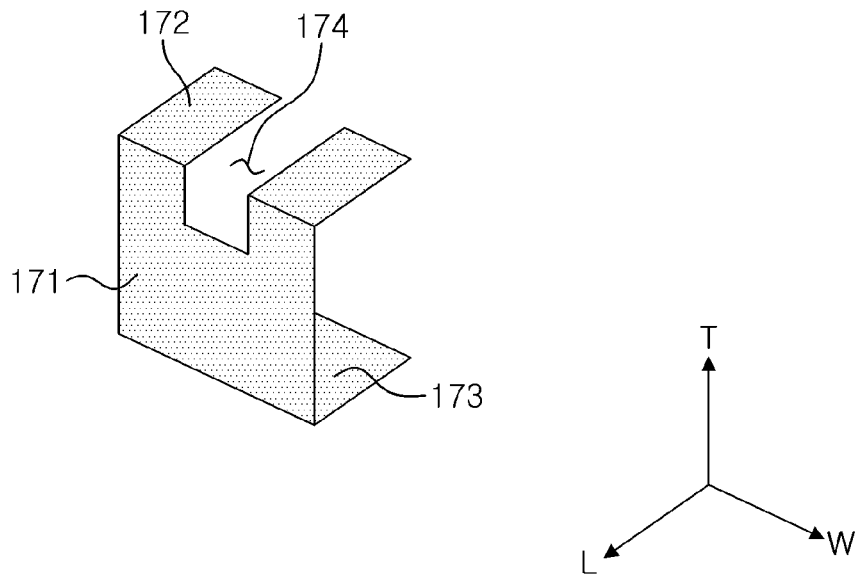
FIGS. 6 through 8 are perspective views showing various examples of a terminal frame applied to a multilayer ceramic capacitor according to an embodiment of the present invention.
Figure 7:
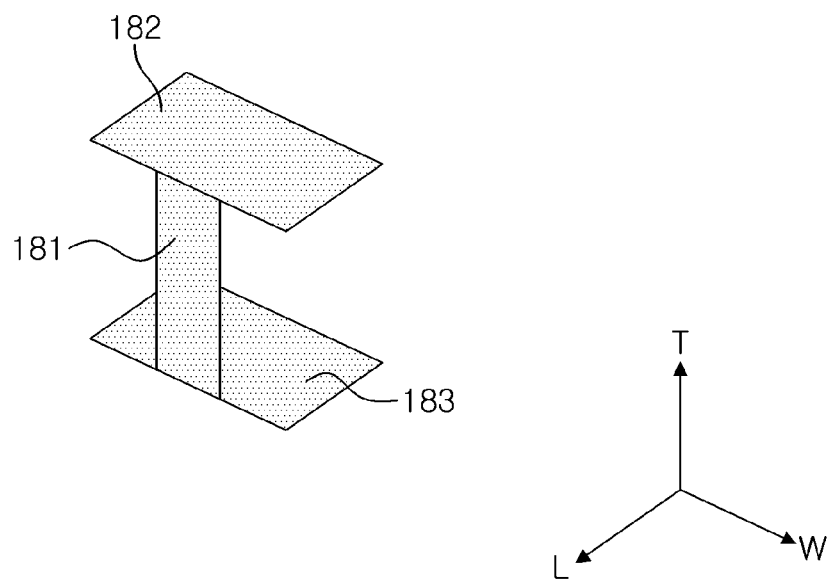
Figure 8:
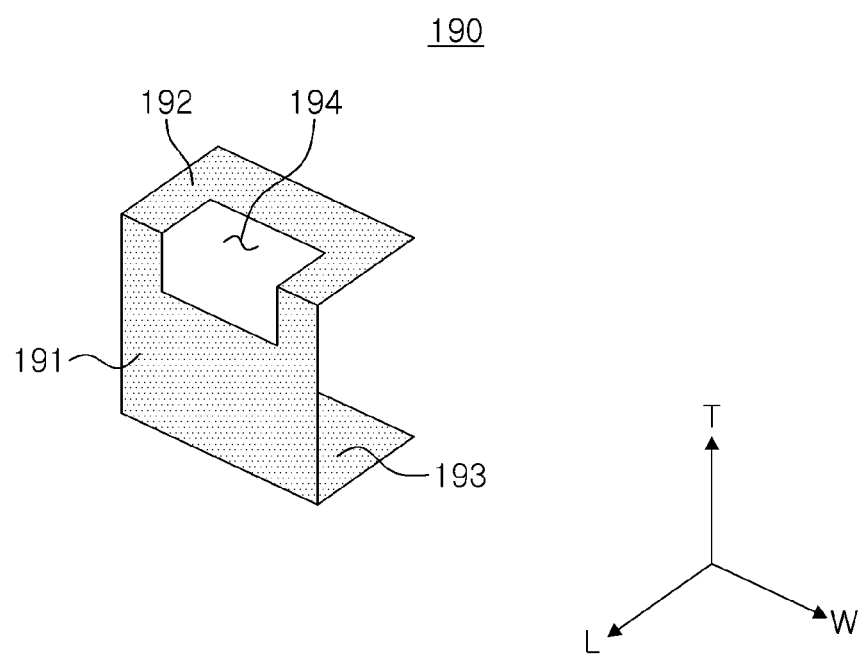

FIGS. 6 through 8 are perspective views showing various examples of a terminal frame applied to a multilayer ceramic capacitor according to an embodiment of the present invention.

Referring to FIG. 6, a first terminal frame 170 may include an opening 174 provided in a portion thereof connecting a vertical portion 171 and an upper horizontal portion 172 to each other, and the upper horizontal portion 172 may be divided into two portions by the opening 174. A second terminal frame having a structure symmetrical to that of the first terminal frame 170 is not illustrated.

However, the invention is not limited thereto. In cases, two or more openings 174 may be formed, and the upper horizontal portion 172 may be divided into three or more portions thereby.

Referring to FIG. 7, a first terminal frame 180 may include a vertical portion 181 having a width narrower than that of upper and lower horizontal portions 182 and 183. A second terminal frame having a structure symmetrical to that of the first terminal frame 180 is not illustrated.

Referring to FIG. 8, a first terminal frame 190 may include an opening 194 provided in a perforated manner in a portion thereof connecting a vertical portion 191 and an upper horizontal portion 192 to each other. The opening may also be formed in a portion of the first terminal frame 190 connecting the vertical portion 191 and a lower horizontal portion 193 to each other. A second terminal frame having a structure symmetrical to that of the first terminal frame 190 is not illustrated.

As set forth above, in a multilayer ceramic capacitor according to embodiments of the invention, external electrodes are formed on a surface of a ceramic body opposing a mounting surface and terminal frames are formed to have a '⌞' shape and be adhered to the external electrodes, such that there is no need to increase a distance between the terminal frames and a circuit board to be more than a predetermined standard distance, whereby a height of a product on which the multilayer ceramic capacitor is mounted may be reduced. In addition, vibrations generated by a piezoelectric phenomenon in the multilayer ceramic capacitor may be absorbed by elastic force of the terminal frames, such that acoustic noise generated due to the vibrations transferred to the circuit board may be reduced.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
   a ceramic body formed by laminating a plurality of dielectric layers in a width direction;
   a plurality of first and second internal electrodes disposed to face each other within the ceramic body, having each of the dielectric layers interposed therebetween, and having respective lead portions exposed to an upper surface of the ceramic body;
   first and second external electrodes formed on the upper surface of the ceramic body and connected to the lead portions, respectively; and
   first and second terminal frames each including a vertical portion facing end surfaces of the ceramic body and upper and lower horizontal portions facing upper and lower surfaces of the ceramic body, respectively,
   wherein the upper horizontal portions of the first and second terminal frames are connected to the first and second external electrodes, respectively, and
   adhesive layers are provided only between the upper horizontal portions and the first and second external electrodes, respectively.

2. The multilayer ceramic capacitor of claim 1, wherein the adhesive layers are provided in a dot shape so that the upper horizontal portions locally contact the external electrodes.

3. The multilayer ceramic capacitor of claim 1, wherein the first and second terminal frames include:
   downward protrusions formed on the upper horizontal portions to locally contact the first and second external electrodes, respectively; and
   upward protrusions formed on the lower horizontal portions so as to locally contact the lower surface of the ceramic body, respectively,
   gaps being provided between the ceramic body and the first and second terminal frames, respectively.

4. The multilayer ceramic capacitor of claim 1, further comprising first and second plating layers formed on the first and second external electrodes.

5. The multilayer ceramic capacitor of claim 4, wherein the first and second plating layers include:
   a nickel (Ni) plating layer formed on the first and second external electrodes; and
   a tin (Sn) plating layer formed on the nickel plating layer.

6. The multilayer ceramic capacitor of claim 1, wherein the first and second terminal frames include an opening formed in at least one of portions thereof connecting the vertical portion and the upper and lower horizontal portions to each other.

7. The multilayer ceramic capacitor of claim 1, wherein the vertical portion has a width narrower than that of the upper and lower horizontal portions.

8. A mounting circuit board for a multilayer ceramic capacitor, the mounting circuit board comprising:
   a circuit board having first and second electrode pads formed thereon; and
   at least one multilayer ceramic capacitor mounted on the circuit board;
   wherein the multilayer ceramic capacitor includes:
   a ceramic body formed by laminating a plurality of dielectric layers in a width direction;
   a plurality of first and second internal electrodes disposed to face each other within the ceramic body, having each of the dielectric layers interposed therebetween, and having respective lead portions exposed to an upper surface of the ceramic body;
   first and second external electrodes formed on the upper surface of the ceramic body and connected to the lead portions, respectively; and
   first and second terminal frames each including a vertical portion facing end surfaces of the ceramic body and upper and lower horizontal portions facing upper and lower surfaces of the ceramic body, respectively,
   the upper horizontal portions of the first and second terminal frames being connected to the first and second external electrodes, respectively,
   adhesive layers being provided only between the upper horizontal portions and the first and second external electrodes, respectively, and
   the lower horizontal portions and the first and second electrode pads being connected to each other by a solder.

9. The mounting circuit board of claim 8, wherein the adhesive layers of the multilayer ceramic capacitor are provided in a dot shape so that the upper horizontal portions locally contact the external electrodes.

10. The mounting circuit board of claim 8, wherein the first and second terminal frames of the multilayer ceramic capacitor include:
    downward protrusions formed on the upper horizontal portions to locally contact the first and second external electrodes, respectively; and
    upward protrusions formed on the lower horizontal portions to locally contact the lower surface of the ceramic body, respectively,
    gaps being provided between the ceramic body and the first and second terminal frames, respectively.

11. The mounting circuit board of claim 8, wherein the multilayer ceramic capacitor further includes first and second plating layers formed on the first and second external electrodes.

12. The mounting circuit board of claim 11, wherein the first and second plating layers of the multilayer ceramic capacitor include:
   a nickel (Ni) plating layer formed on the first and second external electrodes; and
   a tin (Sn) plating layer formed on the nickel plating layer.

* * * * *